(12) United States Patent
Huang et al.

(10) Patent No.: US 11,853,522 B2
(45) Date of Patent: Dec. 26, 2023

(54) TOUCH DISPLAY PANEL, MANUFACTURING METHOD THEREOF, AND TOUCH DISPLAY DEVICE

(71) Applicant: Wuhan China Star Optoelectronics Semiconductor Display Technology Co., Ltd., Hubei (CN)

(72) Inventors: Tienwang Huang, Hubei (CN); Jie Xu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 212 days.

(21) Appl. No.: 17/414,445

(22) PCT Filed: Jun. 22, 2020

(86) PCT No.: PCT/CN2020/097543
§ 371 (c)(1),
(2) Date: Jun. 16, 2021

(87) PCT Pub. No.: WO2021/196418
PCT Pub. Date: Oct. 7, 2021

(65) Prior Publication Data
US 2022/0308690 A1 Sep. 29, 2022

(30) Foreign Application Priority Data
Apr. 3, 2020 (CN) .......................... 202010257806.4

(51) Int. Cl.
*G06F 3/046* (2006.01)
*G06F 3/041* (2006.01)
*H10K 59/40* (2023.01)

(52) U.S. Cl.
CPC ............ *G06F 3/046* (2013.01); *G06F 3/0412* (2013.01); *G06F 2203/04103* (2013.01); *H10K 59/40* (2023.02)

(58) Field of Classification Search
CPC .................. G06F 3/046; G06F 3/0412; G06F 2203/04103; H10K 59/40
See application file for complete search history.

(56) References Cited

U.S. PATENT DOCUMENTS

2010/0302199 A1 12/2010 Taylor et al.
2013/0076687 A1 3/2013 Giddings et al.
(Continued)

FOREIGN PATENT DOCUMENTS

| CN | 103472952 | 12/2013 |
| CN | 103941946 | 7/2014 |

(Continued)

*Primary Examiner* — Lisa S Landis

(57) ABSTRACT

A touch display panel, a manufacturing method thereof, and a touch display device are provided. The touch display panel includes a driving circuit layer, a light-emitting functional layer, an encapsulation layer, and a touch layer stacked on the substrate. The touch layer includes an electrode layer and a signal conversion layer. The electrode layer is formed by growing a ferromagnetic material on the encapsulation layer. The signal conversion layer is configured to convert a change of a magnetic signal at a touch position into an electrical signal. An interaction between a human bioelectricity and the touch layer is used to improve touch sensitivity.

16 Claims, 5 Drawing Sheets

(56) References Cited

U.S. PATENT DOCUMENTS

| | | | |
|---|---|---|---|
| 2014/0120634 A1 | 5/2014 | Bang | |
| 2015/0015536 A1* | 1/2015 | Chang | G06F 3/0412 345/174 |
| 2016/0313837 A1* | 10/2016 | Zhu | G06F 3/0412 |
| 2019/0220123 A1* | 7/2019 | Kanaya | G06F 3/0443 |

FOREIGN PATENT DOCUMENTS

| | | |
|---|---|---|
| CN | 104750285 | 7/2015 |
| CN | 105808005 | 7/2016 |
| CN | 108664175 | 10/2018 |
| WO | WO-2018004648 A1 * | 1/2018 |

* cited by examiner

TOUCH DISPLAY PANEL, MANUFACTURING METHOD THEREOF, AND TOUCH DISPLAY DEVICE

RELATED APPLICATIONS

This application is a National Phase of PCT Patent Application No. PCT/CN2020/097543 having International filing date of Jun. 22, 2020, which claims the benefit of priority of Chinese Patent Application No. 202010257806.4 filed on Apr. 3, 2020. The contents of the above applications are all incorporated by reference as if fully set forth herein in their entirety.

FIELD AND BACKGROUND OF THE INVENTION

The present application relates to the field of display technologies, and more particularly to a touch display panel, a manufacturing method thereof, and a touch display device.

Because active matrix organic light emitting displays (AMOLEDs) have many advantages such as light, thin, unbreakable, bendable, foldable, wearable, and so on, they are often used in flexible products. Touch methods currently applied to flexible AMOLEDs in the current market are mostly capacitive touch, and because a touch layer is closer to an OLED electrode, a self-inductance capacitance of touch itself is larger. The principle of touch control is shown in FIG. 1. When a finger touches a touch screen, a sensing capacitance Cf is generated and transmitted to a touch IC. When the sensing capacitance Cf is greater than the self-inductance capacitance Cb, a position of the touch is recognized by the IC to make feedback. When the finger is away, the sensing capacitor Cf is equal to 0, the IC recognizes the position and makes corresponding feedback. However, when the flexible AMOLED has a touch requirement when bending, the sensing capacitance Cf generated by the finger touching a touch display panel is more likely to cause signal interference because the sensing capacitance Cf is smaller than the self-inductance capacitance Cb. This causes the touch IC to fail to recognize the touch position, and touch sensitivity is low, resulting in abnormal touch.

Therefore, the current touch display panels have issues of low touch sensitivity that needs to be resolved.

SUMMARY OF THE INVENTION

The present application provides a touch display panel, a manufacturing method thereof, and a touch display device, to alleviate technical problems of low touch sensitivity of current touch display panels.

In order to solve the above issues, technical solutions provided by the present application are as follows:

An embodiment of the present application provides a touch display panel comprising a substrate, a driving circuit layer, a light-emitting functional layer, an encapsulation layer, and a touch layer. The driving circuit layer is disposed on the substrate. The light-emitting functional layer is disposed on the driving circuit layer. The encapsulation layer is disposed on the light-emitting functional layer. The touch layer is disposed on the encapsulation layer. The touch layer comprises an electrode layer and a signal conversion layer, material of the electrode layer comprises a ferromagnetic material, and the signal conversion layer is configured to convert a magnetic signal into an electrical signal.

The touch display panel according to an embodiment of the present application, the ferromagnetic material comprises $BiFeO_3$.

The touch display panel according to an embodiment of the present application, the encapsulation layer comprises a first inorganic encapsulation layer, an organic encapsulation layer, and a second inorganic encapsulation layer, material of the second inorganic encapsulation layer comprises one or a combination of $SiO_x$, $SiN_x$, or $SiNO$, and the electrode layer is disposed on the second inorganic encapsulation layer.

The touch display panel according to an embodiment of the present application, the electrode layer comprises a first touch electrode layer, an insulating layer, and a second touch electrode layer. The first touch electrode layer is disposed on the second inorganic encapsulation layer and comprises at least two sensing electrodes arranged at intervals. The insulating layer is disposed on the first touch electrode layer. The second touch electrode layer is disposed on the insulating layer and comprises at least two driving electrodes arranged at intervals. The sensing electrode is parallel to a first direction, the driving electrode is parallel to a second direction, and an angle between the first direction and the second direction is greater than zero degrees.

The touch display panel according to an embodiment of the present application, the electrode layer comprises a sensing electrode and a driving electrode, the sensing electrode and the driving electrode are disposed in a same layer, the sensing electrode is parallel to a first direction, the driving electrode is parallel to a second direction, and an angle between the first direction and the second direction is greater than zero degrees.

The touch display panel according to an embodiment of the present application, an intersection of the sensing electrode and the driving electrode is bridged by a via hole.

The touch display panel according to an embodiment of the present application, the signal conversion layer is disposed on the electrode layer, and the signal conversion layer comprises a Hall element.

An embodiment of the present application provides a touch display device comprising a touch display panel and a touch processing module. The touch display panel comprises a substrate, a driving circuit layer, a light-emitting functional layer, an encapsulation layer, and a touch layer. The driving circuit layer is disposed on the substrate. The light-emitting functional layer is disposed on the driving circuit layer. The encapsulation layer is disposed on the light-emitting functional layer. The touch layer is disposed on the encapsulation layer. The touch layer comprises an electrode layer and a signal conversion layer, material of the electrode layer comprises a ferromagnetic material, the signal conversion layer is configured to convert a magnetic signal into an electrical signal, and the touch processing module is configured to receive the electrical signal from the signal conversion layer and output a corresponding instruction.

The touch display device according to an embodiment of the present application, the ferromagnetic material comprises $BiFeO_3$.

The touch display device according to an embodiment of the present application, the encapsulation layer comprises a first inorganic encapsulation layer, an organic encapsulation layer, and a second inorganic encapsulation layer, material of the second inorganic encapsulation layer comprises one or a combination of $SiO_x$, $SiN_x$, or $SiNO$, and the electrode layer is disposed on the second inorganic encapsulation layer.

The touch display device according to an embodiment of the present application, the electrode layer comprises a first touch electrode layer, an insulating layer, and a second touch electrode layer. The first touch electrode layer is disposed on the second inorganic encapsulation layer and comprises at least two sensing electrodes arranged at intervals. The insulating layer is disposed on the first touch electrode layer. The second touch electrode layer is disposed on the insulating layer and comprising at least two driving electrodes arranged at intervals. The sensing electrode is parallel to a first direction, the driving electrode is parallel to a second direction, and an angle between the first direction and the second direction is greater than zero degrees.

The touch display device according to an embodiment of the present application, the electrode layer comprises a sensing electrode and a driving electrode, the sensing electrode and the driving electrode are disposed in a same layer, the sensing electrode is parallel to a first direction, the driving electrode is parallel to a second direction, and an angle between the first direction and the second direction is greater than zero degrees.

The touch display device according to an embodiment of the present application, an intersection of the sensing electrode and the driving electrode is bridged by a via hole.

The touch display device according to an embodiment of the present application, the signal conversion layer is disposed on the electrode layer, and the signal conversion layer comprises a Hall element.

An embodiment of the present application provides a method of manufacturing a touch display panel comprising following steps. Step S10: forming a display panel comprising providing a substrate and sequentially forming a driving circuit layer, a light-emitting functional layer, and an encapsulation layer on the substrate. Step S20: forming a touch layer comprising sequentially forming an electrode layer and a signal conversion layer on the encapsulation layer.

The method of manufacturing the touch display panel according to an embodiment of the present application, forming the electrode layer comprises sequentially forming a first touch electrode layer, an insulating layer, and a second touch electrode layer on the encapsulation layer, the first touch electrode layer comprises at least two sensing electrodes arranged at intervals, the second touch electrode layer comprises at least two driving electrodes arranged at intervals, the sensing electrode is parallel to a first direction, the driving electrode is parallel to a second direction, and an angle between the first direction and the second direction is greater than zero degrees.

The method of manufacturing the touch display panel according to an embodiment of the present application, materials of the first touch electrode layer and the second touch electrode layer both comprise ferromagnetic materials.

The method of manufacturing the touch display panel according to an embodiment of the present application, the ferromagnetic material comprises $BiFeO_3$.

The method of manufacturing the touch display panel according to an embodiment of the present application, in the step S20, the ferromagnetic material is formed on the encapsulation layer using a pulse laser technique or a molecular beam epitaxy method.

The method of manufacturing the touch display panel according to an embodiment of the present application, the signal conversion layer comprises a Hall element.

The beneficial effects of the present application comprise that: in a touch display panel, a manufacturing method thereof, and a touch display device provided by the present application, the touch layer includes an electrode layer and a signal conversion layer, and the electrode layer uses pulsed laser technology or molecular beam epitaxy to grow ferromagnetic material on the encapsulation layer. When a finger touches the touch display panel, a bioelectric signal of a human body generates a biomagnetic signal to magnetize a ferromagnetic thin-film electrode at a touch position, which further causes a change in a magnetic induction intensity at the touch position. Further, a magnetic flux at the touch position increases. The Hall element of the signal conversion layer converts changes in magnetic flux into changes in electrical signals. The touch processing module determines the touch position according to the change of the received electrical signal, and then outputs a corresponding instruction, thereby improving touch sensitivity of the touch display panel.

BRIEF DESCRIPTION OF THE SEVERAL VIEWS OF THE DRAWINGS

In order to more clearly explain embodiments or technical solutions in the prior art, the following will briefly introduce drawings required in the description of the embodiments or the prior art. Obviously, the drawings in the following description are only some embodiments of the present invention. For those of ordinary skill in the art, without paying any creative work, other drawings can be obtained based on the drawings.

DESCRIPTION OF SPECIFIC EMBODIMENTS OF THE INVENTION

Figure 1:
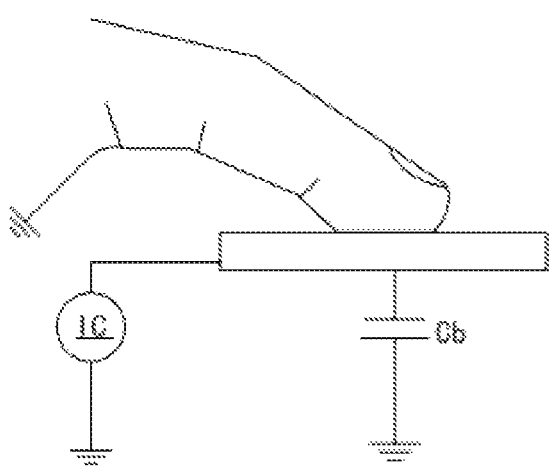
FIG. 1 is a schematic diagram of a touch principle of a capacitive touch in the prior art.

The descriptions of the following embodiments refer to attached drawings to illustrate specific embodiments that can be implemented in the present application. Directional terms mentioned in the present application, such as "upper", "lower", "front", "back", "left", "right", "inner", "outer", "side", etc., just refer to directions of the attached drawings. Therefore, the directional term used is to illustrate and understand the present application, not to limit the present application. In the figure, units with similar structures are indicated by the same reference numerals.

Figure 2:
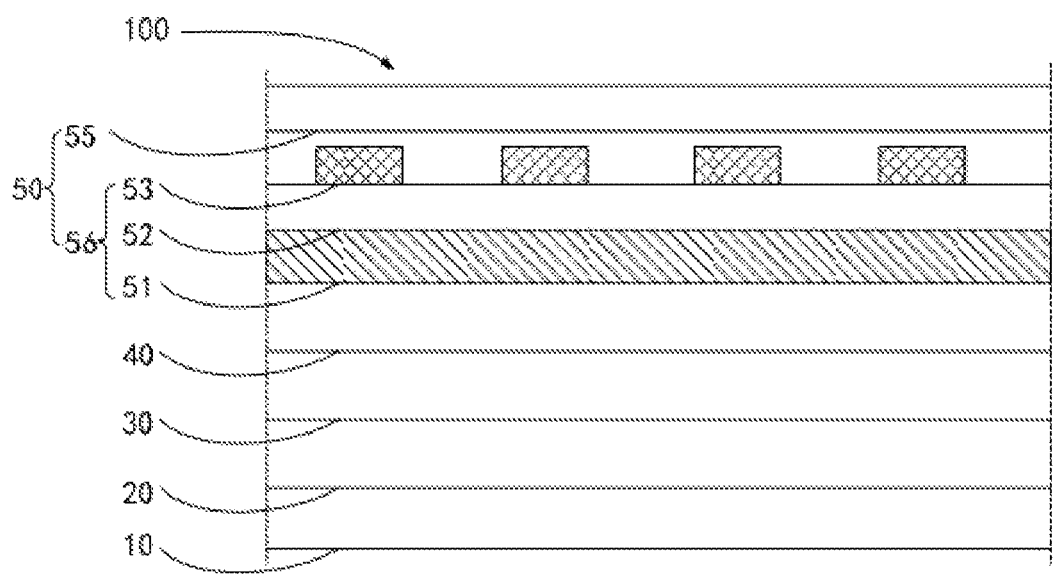
FIG. 2 is a schematic side view of a first film structure of a touch display panel provided by an embodiment of the present application.

In one embodiment, as shown in FIG. 2, a touch display panel 100 is provided, which includes a substrate 10, a driving circuit layer 20, a light-emitting functional layer 30, an encapsulation layer 40, and a touch layer 50. The driving circuit layer 20 is disposed on the substrate 10. The light-emitting functional layer 30 is disposed on the driving circuit layer 20. The encapsulation layer 40 is disposed on the light-emitting functional layer 30. The touch layer 50 is disposed on the encapsulation layer 40. The touch layer 50 includes an electrode layer 56 and a signal conversion layer 55. Material of the electrode layer 56 includes a ferromagnetic material. The signal conversion layer 55 is configured to convert a magnetic signal into an electrical signal.

Specifically, the encapsulation layer 40 includes a first inorganic encapsulation layer, an organic encapsulation layer, and a second inorganic encapsulation layer that are stacked.

Further, materials of the first inorganic encapsulation layer and the second inorganic encapsulation layer may be one or a combination of several types of inorganic materials such as silicon oxide (SiOx), silicon nitride (SiNx), or silicon oxynitride (SiNO). The electrode layer is provided on the second inorganic encapsulation layer.

Further, the ferromagnetic material may be a ferromagnetic substance such as BiFeO3.

Specifically, the electrode layer 56 includes a first touch electrode layer 51, an insulating layer 52, and a second touch electrode layer 53. As shown in FIG. 2, the first touch electrode layer 51 is disposed on the second inorganic encapsulation layer. The insulating layer 52 is disposed on the first touch electrode layer 51. The second touch electrode layer 53 is disposed on the insulating layer 52.

Figure 3:
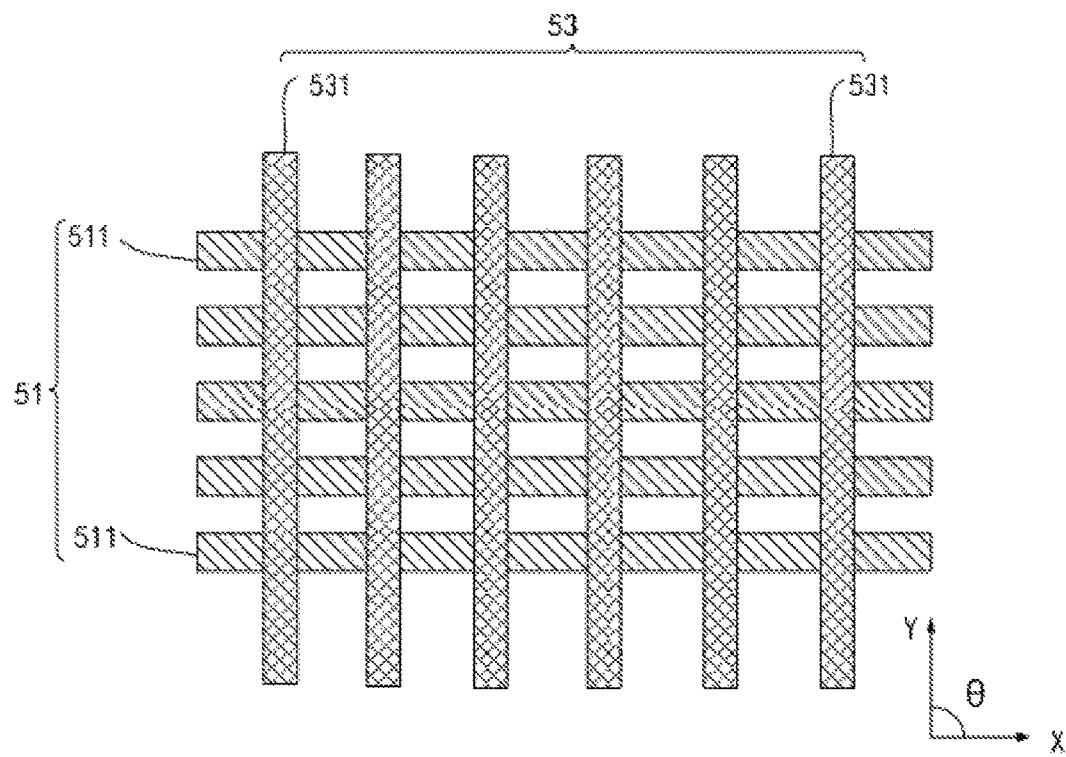
FIG. 3 is a schematic bottom view of a first structure of a touch layer provided by an embodiment of the present application.

Specifically, as shown in FIG. 3, which is a schematic diagram of a bottom view of a touch layer. The first touch electrode layer 51 includes at least two sensing electrodes 511 disposed at intervals, and the second touch electrode layer 53 includes at least two driving electrodes 531 disposed at intervals. The sensing electrode 511 is parallel to a first direction X, the driving electrode 531 is parallel to a second direction Y, and an angle θ between the first direction X and the second direction Y is greater than zero degrees. For the sake of simplifying the manufacturing process, the angle θ shown in FIG. 3 is 90 degrees.

It should be noted that the vertical positional relationship and arrangement direction of the driving electrode and the sensing electrode are not limited to those listed in the embodiments of the present application. The driving electrode may also be disposed under the sensing electrode, the driving electrode is parallel to the first direction, and the sensing electrode is parallel to the second direction.

Further, the material of the insulating layer may be one or a combination of several types of inorganic materials such as silicon oxide (SiOx), silicon nitride (SiNx), or silicon oxynitride (SiNO). This serves to insulate the first touch electrode layer and the second touch electrode layer from each other.

Specifically, as shown in FIG. 2, the signal conversion layer 55 is disposed on the electrode layer 56. Specifically, the signal conversion layer 55 is disposed on the second touch electrode layer 53. Of course, an insulating layer (not shown in FIG. 2) is further disposed between the signal conversion layer and the second touch electrode layer.

Specifically, the signal conversion layer includes a Hall element, and the Hall element can convert the change of the magnetic induction signal passing through the Hall element into the change of the electrical signal.

Figure 4:
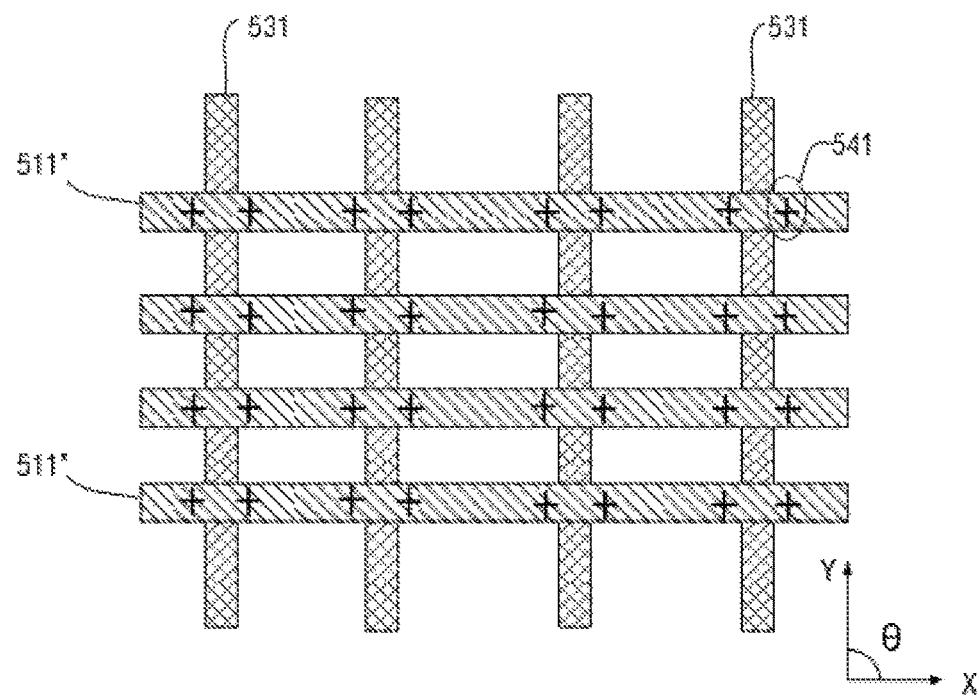
FIG. 4 is a schematic bottom view of a second structure of a touch layer provided by an embodiment of the present application.

In one embodiment, different from the above embodiment, as shown in FIG. 4, the electrode layer includes a sensing electrode 511' and a driving electrode 531'. The sensing electrode 511' and the driving electrode 531' are disposed in the same layer. The sensing electrode 511' is parallel to the first direction X, the driving electrode 531' is parallel to the second direction Y, and the angle θ between the first direction X and the second direction Y is greater than zero degrees. The intersection of the sensing electrode 511' and the driving electrode 531' is bridged by a via hole 541.

Figure 5:
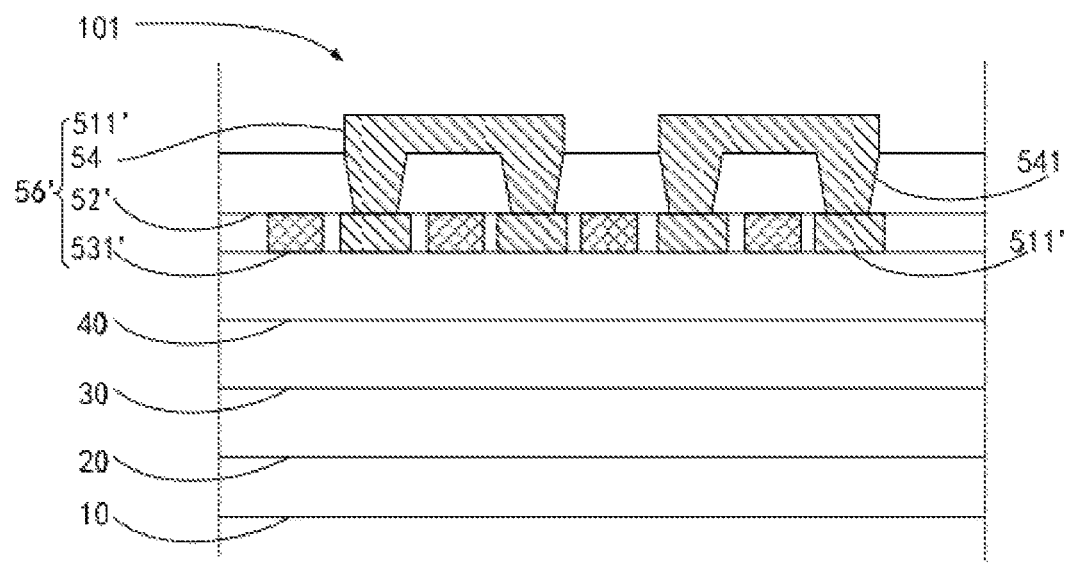
FIG. 5 is a schematic side view of a second film layer structure of a touch display panel provided by an embodiment of the present application.

Specifically, as shown in FIG. 5, the electrode layer 56' further includes an insulating layer 52' and a bridge layer 54, the insulating layer 52' is patterned with the via hole 541. The driving electrode 531' or the sensing electrode 511' is bridged with the bridge layer 54 through the via hole 541. It is shown in FIG. 5 that the sensing electrode 511' is bridged with the bridge layer 54 through the via hole 541.

Specifically, the material of the bridge layer 54 is the same as the material of the driving electrode 531' or the sensing electrode 511'.

Figure 6:
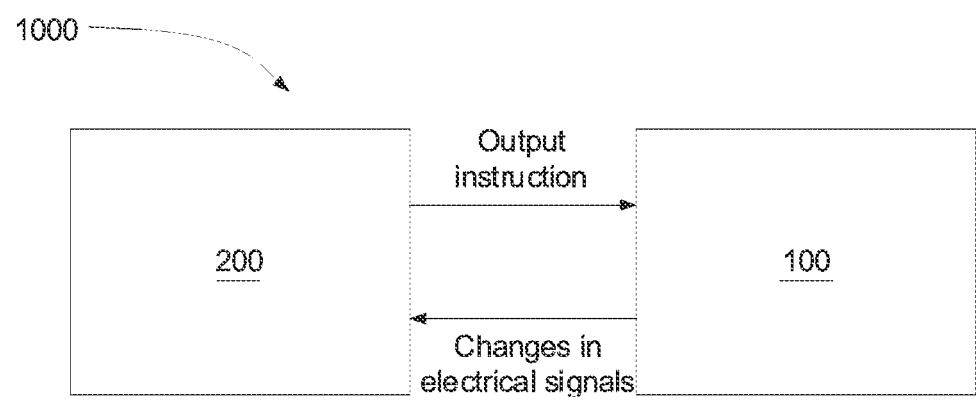
FIG. 6 is a schematic block diagram of a touch display device provided by an embodiment of the present application.

In one embodiment, a touch device 1000 is provided as shown in FIG. 6, which includes a touch display panel 100 and a touch processing module 200 in one of the above embodiments. The touch processing module 200 is configured to receive a change of an electrical signal output from the signal conversion layer on the touch display panel 100 to determine coordinates of a touch position, and then output a corresponding instruction.

Specifically, the touch processing module may be a touch chip or a separate printed control circuit board and other components.

Figure 7:
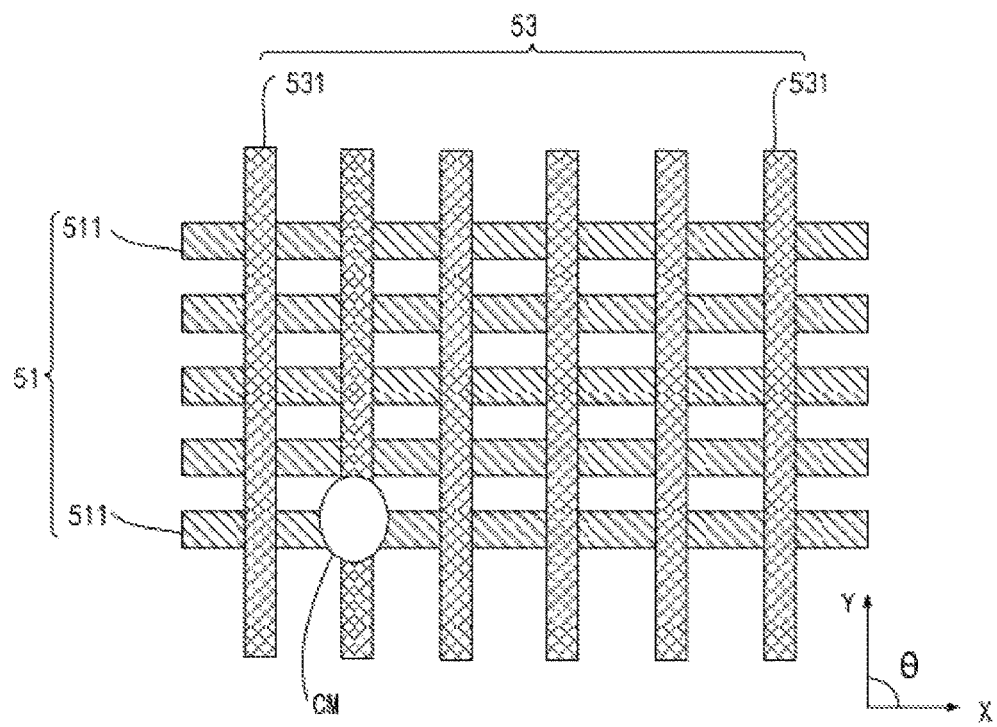
FIG. 7 is a schematic structural diagram of a bottom view of a touch layer when touched provided by an embodiment of the present application.

Specifically, as shown in FIG. 7, when a finger touches the touch display panel, the driving electrode 531 and the sensing electrode 511 at a touch position CM are both magnetized due to influence of a human biomagnetic signal. This increases a magnetic induction strength of the driving electrode 531 and the sensing electrode 511 of the touch position, which further increases a magnetic flux of the touch position CM. When the Hall element of the signal conversion layer detects a change of the magnetic flux, it will convert a magnetic signal of the changed magnetic flux into a change of an electric signal and output it to a touch control module. After receiving the change of the electrical signal, the touch processing module can recognize the correspondingly changed driving electrode and sensing electrode, and then determine coordinates of the touch position.

It should be noted that generation of human biological magnetic signals is due to a continuous redox reaction of human life activities. During these biochemical reactions, a transfer of electrons takes place, and the transfer of electrons or a movement of ions can form an electric current called a biological current. A moving electric charge generates a magnetic field. Therefore, all parts of a human body that can generate bioelectrical signals must also generate biomagnetic signals.

Figure 8:
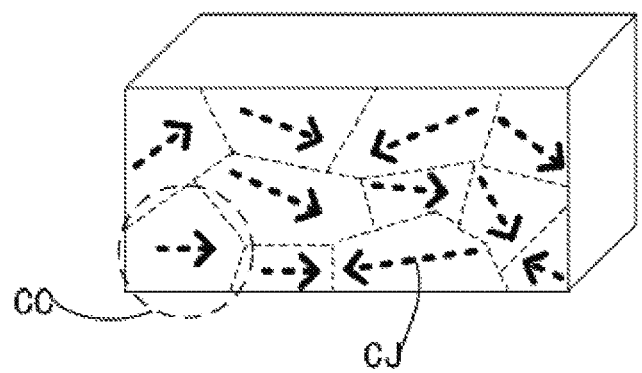
FIG. 8 is a schematic diagram of the arrangement of magnetic moment directions in magnetic domains when a ferromagnetic substance is not subjected to an external magnetic field provided by an embodiment of the present application.
Figure 9:
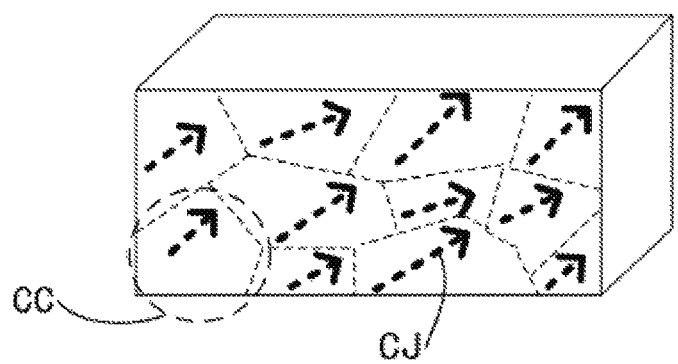
FIG. 9 is a schematic diagram of an arrangement of magnetic moment directions in magnetic domains when a ferromagnetic substance is subjected to an external magnetic field provided by an embodiment of the present application.

Specifically, there are many magnetic domains CC inside a ferromagnetic substance. Without being disturbed by an external magnetic field, a magnetic moment CJ of the magnetic domain CC in the ferromagnetic substance is oriented in different directions, as shown in FIG. 8. When a finger touches, under influence of a biomagnetic signal generated by a human body, the magnetic moment CJ of the magnetic domain CC inside the ferromagnetic substance tends to be in the same direction as the external magnetic field, as shown in FIG. 9.

Figure 10:
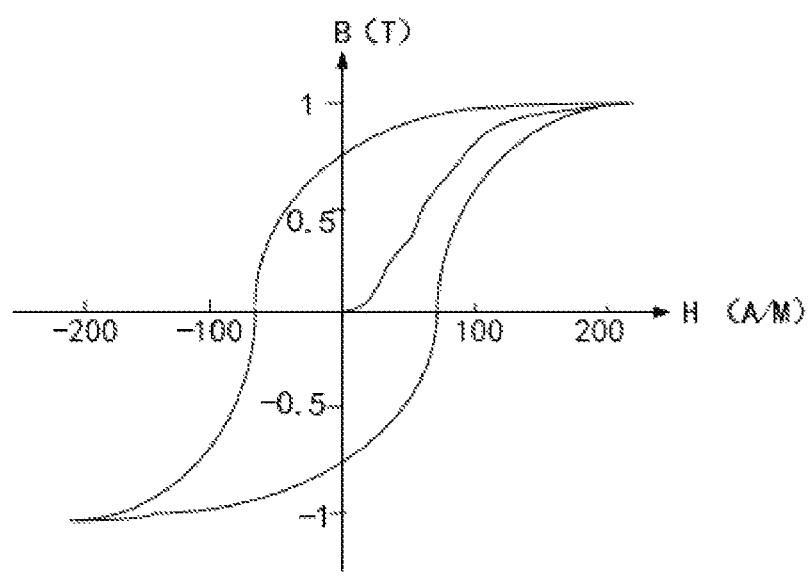
FIG. 10 is a schematic diagram of a hysteresis loop of a ferromagnetic substance provided by an embodiment of this application.

Furthermore, the change of the direction of the magnetic moment in the magnetic domain is also the process of the ferromagnetic substance being magnetized. The ferromagnetic substance is magnetized to produce a magnetic field change. As a magnetic field strength H changes, a magnetic induction B also changes. As shown in FIG. 10, the magnetic induction B increases as the magnetic field strength H increases.

Further, a change in magnetic induction intensity increases a magnetic flux at a touched position. When the Hall element senses the change of magnetic flux, it will output the corresponding electrical signal change. After receiving the change of the electrical signal, the touch processing module can determine coordinates of the touch position, and then determine a touch point.

In one embodiment, a method of manufacturing a touch display panel includes following steps.

Step S10: forming a display panel comprising providing a substrate and sequentially forming a driving circuit layer, a light-emitting functional layer, and an encapsulation layer on the substrate.

Step S20: forming a touch layer comprising sequentially forming an electrode layer and a signal conversion layer on the encapsulation layer.

Specifically, in step S10, the encapsulation layer includes a first inorganic encapsulation layer, an organic encapsulation layer, and a second inorganic encapsulation layer. Materials of the first inorganic encapsulation layer and the second inorganic encapsulation layer include one or a combination of several types of inorganic materials such as silicon oxide (SiOx), silicon nitride (SiNx), or silicon oxynitride (SiNO).

Further, the first inorganic encapsulation layer and the second inorganic encapsulation layer may be prepared by one of physical vapor deposition method, chemical vapor deposition method, atomic layer deposition method, and other deposition processes. The organic layer can be prepared by processes such as inkjet printing.

In details, in the step S20, forming the electrode layer comprises sequentially forming a first touch electrode layer, an insulating layer, and a second touch electrode layer on the encapsulation layer, the first touch electrode layer comprises at least two sensing electrodes arranged at intervals, the second touch electrode layer comprises at least two driving electrodes arranged at intervals, the sensing electrode is parallel to a first direction, the driving electrode is parallel to a second direction, and an angle between the first direction and the second direction is greater than zero degrees.

Specifically, a method such as pulse laser technology or molecular beam epitaxy method is used to first grow a layer of ferromagnetic material film on the second inorganic encapsulation layer as the first touch electrode layer. Then, a yellow light process is performed on the first touch electrode layer to form electrode patterns arranged at intervals as the sensing electrode. The sensing electrode is parallel to the first direction.

Further, the sensing electrode is covered with an insulating layer, which may be one or a combination of inorganic materials such as silicon oxide (SiOx), silicon nitride (SiNx), or silicon oxynitride (SiNO).

Further, a method such as pulse laser technology or molecular beam epitaxy method is used to first grow a thin layer of ferromagnetic material on the insulating layer as the second touch electrode layer. Then, a yellow light process is performed on the second touch electrode layer to form electrode patterns arranged at intervals as the driving electrode. The driving electrode is parallel to the second direction.

Further, the included angle between the first direction and the second direction is greater than zero degrees, considering the simplification of the manufacturing process, the included angle may be 90 degrees.

Specifically, the ferromagnetic substance includes $BiFeO_3$ and the like.

Further, the signal conversion layer includes a Hall element.

It should be noted that the signal conversion layer of the present application may also be provided between the first touch electrode layer and the second touch electrode layer, or may be provided under the first touch electrode layer. The embodiment will not be repeated here.

According to the above embodiment:

The present application provides a touch display panel, a manufacturing method thereof, and a touch display device. The touch display panel includes a driving circuit layer, a light-emitting functional layer, an encapsulation layer, and a touch layer stacked on a substrate. The touch layer includes an electrode layer and a signal conversion layer. The electrode layer uses pulsed laser technology or molecular beam epitaxy to grow ferromagnetic material on the encapsulation layer. The signal conversion layer includes a Hall element for converting a magnetic signal whose magnetic flux at a touch position changes into an electrical signal. The electrode layer includes a sensing electrode and a driving electrode arranged in the same layer or different layers. The sensing electrode and the driving electrode are arranged in different directions. When a finger touches the touch display panel, a bioelectric signal of a human body generates a biomagnetic signal to magnetize a ferromagnetic thin-film electrode at a touched position, which further causes a change in a magnetic induction intensity at the touched position, which further causes a magnetic flux at the touched position to increase. The Hall element of the signal conversion layer converts changes in magnetic flux into changes in electrical signals. The touch processing module determines the touch position according to the change of the received electrical signal, and then outputs a corresponding instruction, thereby improving touch sensitivity of the touch display panel.

In summary, although the present application has been disclosed as above with preferred embodiments, the above preferred embodiments are not intended to limit the present application. Those of ordinary skill in the art can make various changes and modifications without departing from the spirit and scope of the present application. Therefore, the protection scope of the present application is subject to the scope defined by the claims.

What is claimed is:

1. A touch display panel, comprising:
    a substrate;
    a driving circuit layer disposed on the substrate;
    a light-emitting functional layer disposed on the driving circuit layer;
    an encapsulation layer disposed on the light-emitting functional layer; and
    a touch layer disposed on the encapsulation layer;
    wherein the touch layer comprises an electrode layer and a signal conversion layer, material of the electrode layer comprises a ferromagnetic material, and the signal conversion layer is configured to convert a magnetic signal into an electrical signal;

wherein the electrode layer comprises a sensing electrode and a driving electrode, the sensing electrode and the driving electrode are disposed in a same layer, the electrode layer further comprises an insulating layer and a bridge layer, the insulating layer is patterned with a via hole, the driving electrode or the sensing electrode is bridged with the bridge layer through the via hole, and material of the bridge layer is same as material of the driving electrode or material of the sensing electrode.

2. The touch display panel according to claim 1, wherein the ferromagnetic material comprises BiFeO3.

3. The touch display panel according to claim 1, wherein the encapsulation layer comprises a first inorganic encapsulation layer, an organic encapsulation layer, and a second inorganic encapsulation layer, material of the second inorganic encapsulation layer comprises one or a combination of SiOx, SiNx, or SiNO, and the electrode layer is disposed on the second inorganic encapsulation layer.

4. The touch display panel according to claim 3, wherein the sensing electrode is parallel to a first direction, the driving electrode is parallel to a second direction, and an angle between the first direction and the second direction is greater than zero degrees.

5. The touch display panel according to claim 4, wherein an intersection of the sensing electrode and the driving electrode is bridged by the via hole.

6. The touch display panel according to claim 3, wherein the signal conversion layer is disposed on the electrode layer, and the signal conversion layer comprises a Hall element.

7. A touch display device, comprising:
a touch display panel; and
a touch processor;
wherein the touch display panel comprises:
a substrate;
a driving circuit layer disposed on the substrate;
a light-emitting functional layer disposed on the driving circuit layer;
an encapsulation layer disposed on the light-emitting functional layer; and
a touch layer disposed on the encapsulation layer;
wherein the touch layer comprises an electrode layer and a signal conversion layer, material of the electrode layer comprises a ferromagnetic material, the signal conversion layer is configured to convert a magnetic signal into an electrical signal, and the touch processor is configured to receive the electrical signal from the signal conversion layer and output a corresponding instruction;
wherein the electrode layer comprises a sensing electrode and a driving electrode, the sensing electrode and the driving electrode are disposed in a same layer, the electrode layer further comprises an insulating layer and a bridge layer, the insulating layer is patterned with a via hole, the driving electrode or the sensing electrode is bridged with the bridge layer through the via hole, and material of the bridge layer is same as material of the driving electrode or material of the sensing electrode.

8. The touch display device according to claim 7, wherein the ferromagnetic material comprises BiFeO3.

9. The touch display device according to claim 7, wherein the encapsulation layer comprises a first inorganic encapsulation layer, an organic encapsulation layer, and a second inorganic encapsulation layer, material of the second inorganic encapsulation layer comprises one or a combination of SiOx, SiNx, or SiNO, and the electrode layer is disposed on the second inorganic encapsulation layer.

10. The touch display device according to claim 9, wherein the sensing electrode is parallel to a first direction, the driving electrode is parallel to a second direction, and an angle between the first direction and the second direction is greater than zero degrees.

11. The touch display device according to claim 10, wherein an intersection of the sensing electrode and the driving electrode is bridged by the via hole.

12. The touch display device according to claim 9, wherein the signal conversion layer is disposed on the electrode layer, and the signal conversion layer comprises a Hall element.

13. A method of manufacturing a touch display panel, comprising following steps:
step S10: forming a display panel comprising providing a substrate and sequentially forming a driving circuit layer, a light-emitting functional layer, and an encapsulation layer on the substrate; and
step S20: forming a touch layer comprising sequentially forming an electrode layer and a signal conversion layer on the encapsulation layer;
wherein material of the electrode layer comprises a ferromagnetic material, and the signal conversion layer is configured to convert a magnetic signal into an electrical signal;
wherein the electrode layer comprises a sensing electrode and a driving electrode, the sensing electrode and the driving electrode are disposed in a same layer, the electrode layer further comprises an insulating layer and a bridge layer, the insulating layer is patterned with a via hole, the driving electrode or the sensing electrode is bridged with the bridge layer through the via hole, and material of the bridge layer is same as material of the driving electrode or material of the sensing electrode.

14. The method of manufacturing the touch display panel according to claim 13, wherein the ferromagnetic material comprises BiFeO3.

15. The method of manufacturing the touch display panel according to claim 13, wherein in the step S20, the ferromagnetic material is formed on the encapsulation layer using a pulse laser technique or a molecular beam epitaxy method.

16. The method of manufacturing the touch display panel according to claim 13, wherein the signal conversion layer comprises a Hall element.

* * * * *